Dec. 29, 1964 L. T. FINE 3,163,828

GAIN COMPRESSED AMPLIFIER

Filed Dec. 4, 1961

*INVENTOR.*
LAUGHTON T. FINE
BY Alden D. Redfield
Irwin P. Garfinkle
ATTORNEYS.

3,163,828
Patented Dec. 29, 1964

3,163,828

GAIN COMPRESSED AMPLIFIER

Laughton T. Fine, Cincinnati, Ohio, assignor to Avco Corporation, Cincinnati, Ohio, a corporation of Delaware Filed Dec. 4, 1961, Ser. No. 156,663
15 Claims. (Cl. 330—17)

This invention relates to gain controlled amplifiers, and more particularly to a low frequency or audio amplifier having a large dynamic range with low distortion and high stability.

Many means for the automatic gain control of audio amplifiers are well known to the electronic arts, however, these systems introduce signal distortion which is intolerable in certain applications. The present invention seeks to automatically control the gain of a high gain transistorized speech amplifier to provide output variations of less than 3 db for input variations of 40 db or more, and with minimum distortion. This result is accomplished by a unique combination of gain compression, peak limiting, and negative feedback circuitry to provide the required gain control with distortion correction.

As pointed out in Terman's Fourth Edition of "Electronic and Radio Engineering," published by McGraw-Hill, negative feedback can be used in an amplifier to reduce distortion in accordance with the following equation:

$$D=\frac{d}{1-AB}$$

where $d$ is distortion in absence of feedback; D is distortion with feedback; A is amplifier gain; and B is the magnitude of feedback. The present invention uses this principle to improve the output quality from a gain controlled amplifier. That is to say, this invention reduces distortion by providing a system of automatic gain control in which the degree of negative feedback is automatically varied in relation to the degree of gain control. It will be seen that as the gain factor A is reduced, the feedback factor B is increased so that the distortion magnitude remains fairly constant throughout the control range.

It is the primary object of this invention to provide a relatively high order of gain control for a low frequency amplifier without the introduction of appreciable signal distortion.

Another object of this invention is to provide nonlinear feedback for a gain controlled low frequency amplifier to compensate for distortion resulting from the application of gain control voltages.

Another object of this invention is to provide a transistorized speech amplifier having a high gain output level varying less than 3 db for input levels ranging 40 db or more and having a negligible distortion.

Another object of this invention is to provide a signal amplifier in which amplified negative feedback energy is applied to effect stable gain control while maintaining the quality of the amplified signal.

Still other objects of this invention are to provide a gain controlled amplifier which is relatively stable at high levels of control; which incorporates peak limiting and semiconductor amplification to avoid over control; which requires minimum space, cost and maintenance, and which has hgh reliability and long life expectancy.

For other objects and advantages of this invention and for a more complete description of a working embodiment, reference should now be made to the following detailed specification and to the accompanying drawings in which.

Briefly described, the output from a three-stage transistorized audio amplifier is used to generate direct current automatic gain control signals for controlling the gain of the amplifier in inverse proportion to signal strength. Ordinarily, gain control of an audio amplifier introduces intolerable distortion; in the present invention, however, gain control is achieved by uniquely controlling negative feedback, thereby automatically compensating for the distortion. The negative feedback control is accomplished by simultaneously controlling the series feedback in the emitter circuits of the transistor stages, and the over-all feedback from the last stage to the first stage. This is done by controlling the impedance of a semiconducting diode in response to the magnitude of the automatic gain control signals.

Figure 1:
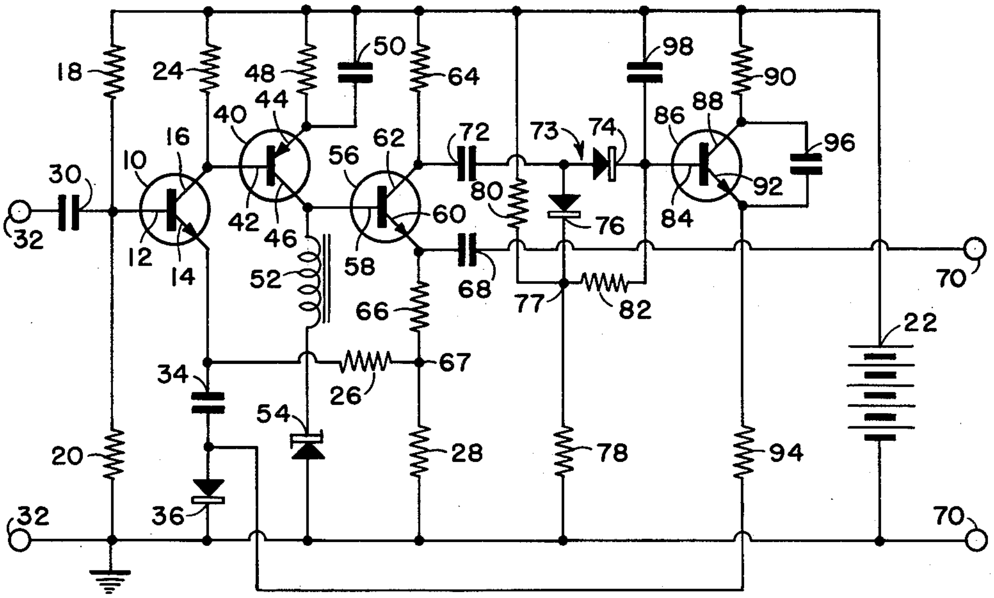
FIG. 1 is a circuit diagram showing a practical embodiment of this invention.

Referring to FIG. 1, the first-stage amplifier comprises an NPN transistor 10 having a base 12, an emitter 14, and a collector 16. Bias for the base 12 is provided by means of a connection to the junction of resistors 18 and 20 which are connected across a battery 22 or other convenient B+ supply. Collector bias is provided by means of a connection to the battery through a resistor 24 while emitter bias is provided by means of a connection to ground through a resistor 26 and a common emitter-resistor 28.

Alternating current input signals are applied to the base 12 through a capacitor 30 from between the terminals 32, while the alternating current signal output from the first-stage transistor is derived from between the collector 16 and ground. The emitter 14 is connected to ground for alternating currents through a capacitor 34 and a semiconductor diode 36, the purposes of which will hereinafter be explained in detail.

The output from the transistor 10 is direct coupled to a second-stage amplifier comprising a PNP type transistor 40 having a base 42, an emitter 44, and a collector 46. The base 42 is connected directly to the collector 16 of transistor 10. The emitter 44 is connected to the positive side of the battery 22 through a parallel-connected resistor 48 and capacitor 50, and the collector 46 is connected to ground through a large inductor 52 and a Zener diode 54.

The collector output of transistor 40 is direct coupled to a third-stage amplifier comprising an NPN transistor 56 having a base 58 connected directly to the collector 46, an emitter 60, and a collector 62. The collector 62 is connected to the positive side of the battery 22 through a resistor 64, while the emitter 60 is connected to ground through a resistor 66 and through the common emitter-resistor 28. It will be pointed out hereafter that the connection from the junction 67 of resistors 66 and 28 to the emitter 14 through resistor 26 constitutes a feedback path which is important to this invention. Signal output from the three stages is derived from the emitter 60 through a coupling capacitor 68 at terminals 70.

For the purpose of deriving signals for controlling the gain of the three-stage amplifier, the voltage variations appearing at the collector 62 are applied through a capacitor 72 for rectification in a demodulator network 73 including two semiconductor diodes 74 and 76. Prebias for the diode 76 is provided by means of a connection to the junction 77 of a voltage dividing network comprising resistors 78 and 80, while pre-bias for the diodes 74 is provided by a connection through resistor 82 to the junction 77.

Demodulated output voltages from the diode 74 are applied to the base 84 of a transistor 86, the collector 88 of which is connected to the positive side of battery 22 through a resistor 90, while the emitter 92 is connected to ground through an emitter-resistor 94 and through the diode 36 in the emitter circuit of transistor 10. A by-pass condenser 96 is connected across the collector 88 and emitter 92, and a by-pass capacitor 98 is connected between the base 84 and the battery 22.

There are several negative feedback networks in the amplifier, one of which is an over-all feedback from the junction 67 to the emitter 14 of transistor 10, through resistor 26. It will be seen that with the transistor types employed, a signal of increased amplitude appearing at junction 67 of resistors 66 and 28 will drive the potential of the emitter 14 toward the collector 16 thereby tending to cut back transistor 10.

In addition, there are degenerative feedback impedances connected in the emitter circuit in each of the transistors 10 and 56, one of which comprises the variable impedance diode 36 in the emitter circuit of transistor 10. The manner in which the impedance of diode 36 is controlled and the effect of such control on the over-all feedback is also a feature of this invention.

Figures 2, 3:
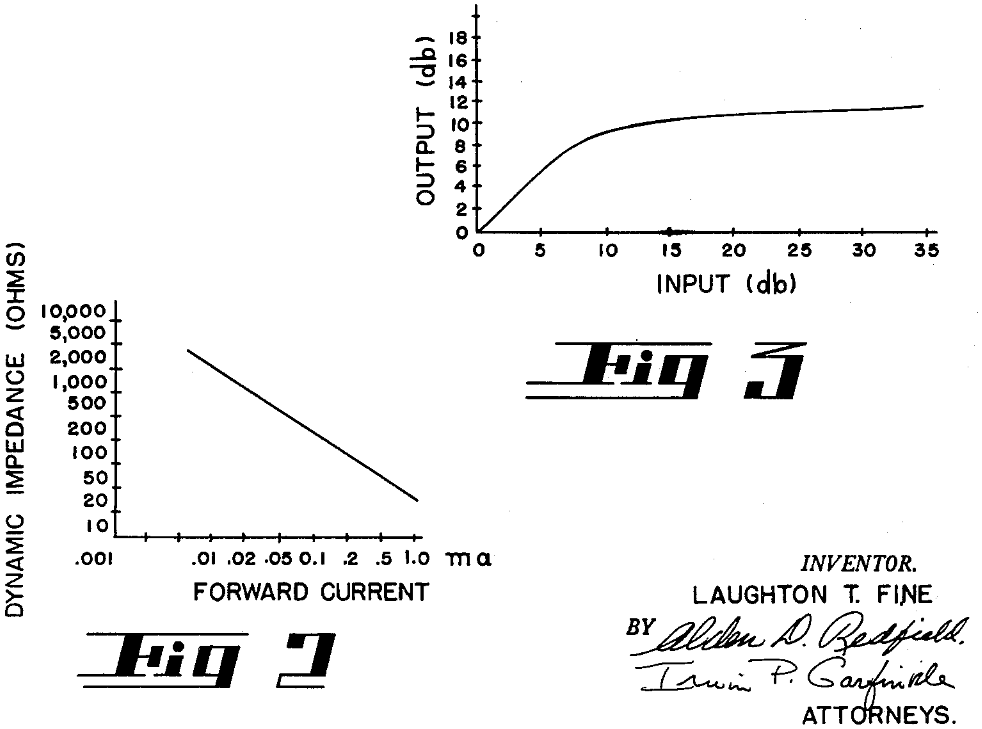
FIG. 2 is a curve showing the dynamic impedance characteristics of a semiconductor diode used in the embodiment of FIG. 1.
FIG. 3 is a curve depicting the relative change of output versus input characteristic of the amplifier illustrated in FIG. 1.

To produce currents which vary as a function of signal strength for controlling the impedance of diode 36, output voltages derived from the collector 62 of the third-stage transistor 56 are demodulated in the demodulator network 73 and amplified by the transistor 86. In the absence of signal applied to the base 84 of transistor 86, the transistor 86 is biased for conduction at or near saturation, and high current flow of about one milliampere results from the battery 22 through the resistor 90, the collector-emitter junction of transistor 86, the resistor 94, and the diode 36. Under these circumstances the impedance of the diode 36 is very low as indicated by the curve of FIG. 2. Current flow in a particular diode in the order of one milliampere resulted in a diode impedance of approximately 40 ohms.

Upon the application of negative-going signals to the base 84 of transistor 86 through the diode 74, the transistor tends to cut back to increase the impedance of the diode 36. Thus signals of increasing magnitude tend to reduce the conduction through the diode 36, and, as seen in FIG. 2, reduction of about .01 milliampere of current flow through the diode 36 resulted in an impedance of about 4,000 ohms.

Increasing the impedance of diode 36 in response to increased signal strength provides two primary results. First, the impedance presented to the emitter 14 of transistor 10 increases, which provides increased degenerative feedback to that transistor. When signal strength is low and the transistor 86 is conducting at or near saturation, the impedance of the diode 36 is low, and hence emitter degeneration is at a minimum and the gain of transistor 10 is at a maximum. However, when signal strength is increased, the impedance of diode 36 increases, decreasing the gain of transistor 10.

And second, the over-all feedback is varied from the output stage to the input stage. Output signal is sampled at junction 67 and transferred to the input stage by the divider formed by resistor 26 and the impedance of the diode 36. Thus, as the impedance of diode 36 increases, the amount of degenerative signal feedback from junction 67 increases at the emitter 14 of transistor 10 to reduce the gain. When signal levels are low and the impedance of diode 36 is low, the signal fed back to emitter 14 is very small, and the over-all gain is of a maximum.

Therefore, gain control is achieved by varying the degree of negative feedback in several feedback networks. That is to say, with increased signals requiring a decrease in gain, the negative feedback throughout the three stages of amplification is increased. In accordance with known art, increased feedback reduces distortion, and hence the primary object of the invention is accomplished.

The pre-bias for the diode 74 is set by means of the connection to the junction 77 through resistor 82 to provide a predetermined threshold of operation. As seen in FIG. 3, the diode 74 is back-biased so that there is only low conduction through it until the input variations exceed approximately 9 db. At this point the diode 74 conducts negative currents to the base 84 of transistor 86 to cut that transistor back. While it is a relatively linear relationship between the input and output variations about 9 db, beyond that point the variations are very non-linear, and for input variations of 40 db or more, the output varies little more than 2 db.

The circuitry includes several features which enhance operation of the system. First, the circuit is provided with peak limiting means to filter high amplitude pulses from the demodulator 73 to avoid over control and undesirable gain compression. For this purpose the transistors 40 and 56 are designed and biased to saturate on voltage peaks in the region of 3 db above the normal compressed output.

It should be noted that the Zener diode 54 is connected in series with the inductor 52 which charges and discharges at a variable rate depending on signal magnitude, to function as a semiconductor diode amplifier. Thus, the bias on the base 58 of transistor 56 is driven by and to an amplified state by modulated signal. This modulated bias drive materially enhances the peak-clipping action of the system against impulse and similar high frequency noise.

The phenomenon of diode amplification is disclosed in United States Patent 2,666,816 to Hunter. The signal introduced at the terminal 32 is amplified through the transistors 10 and 40 such that a highly amplified version of the signal appears across the inductor 52 and the Zener diode 54. The Zener diode exhibits a Zener characteristic at about 3 volts, and the inductor 52 exhibits a resonance due to self-capacitance and the circuit capacities. The charge and discharge of inductor 52 depends directly on the modulation component frequency and amplitude. Inductor 52 charges when transistor 40 conducts and discharges through the base-emitter junction of transistor 56 when transistor 40 stops conducting. This action is cyclic. The discharge loop comprises the inductor 52, the base-emitter junction of transistor 56, resistors 28 and 66, and diode 54 forward biased. Diode 54 becomes a variable impedance varying from near zero resistance to a high resistance, through zero volts to a negative 3 volts, while the resistance is equivalent to 3 volts maintained. Thus the diode 54 is swept from a fairly high forward current through zero to minus 3 volts in a cyclic manner.

While impedance of inductor 52 varies with frequency, the instantaneous impedance of diode 54 is voltage dependent only. Thus diode 54 is pumped with an intensity dependent on signal frequency, signal polarity, and signal amplitude. As indicated by the patent of Hunter, this condition gives rise to diode amplification. The amplification factor in the present case is highest in the low amplitude region and after a voltage, preset by parameter selection, is reached, this circuit tends to function as a power absorption loop.

In addition, diode amplification also occurs as a result of the modulation of the signal derived from the collector 62 of transistor 56. It will be seen that the diode 76 varies in impedance with applied signal, causing variations in the bias applied to the diode 74. Thus, the output from the diode 74 is an amplified direct current component related to the modulated input signal.

The specific embodiment illustrated was incorporated and successfully reduced to practice as an audio amplifier in a mobile communications system. The amplifier was capable of power gains in the order of 100 db and was subject to variations with varying input signal of about 3 db over the useful range of the system. The transistors 40 and 56 were designed to saturate on voltage peaks in the region of about 3 db above the normal compressed output level. The following parameters are set forth for the purpose of better enabling persons skilled in the art to reproduce this invention:

| | |
|---|---|
| Transistor 10 | Type 2N335. |
| Transistor 40 | Type 2N328A. |
| Transistor 56 | Type 2N335. |
| Transistor 86 | Type 2N336. |
| Diode 36 | Type SG22. |
| Diode 54 | Type 1N702A 3 volt Zener. |
| Diode 74 | Type 1N645. |
| Diode 76 | Type 1N645. |
| Capacitor 30 | 10 μf. |
| Capacitor 34 | 10 μf. |
| Capacitor 50 | 10 μf. |
| Capacitor 68 | 10 μf. |
| Capacitor 72 | 1 μf. |
| Capacitor 96 | 10 μf. |
| Capacitor 98 | 10 μf. |
| Resistor 18 | 8.2K ohms. |
| Resistor 20 | 3.3K ohms. |
| Resistor 24 | 6.8K ohms. |
| Resistor 26 | 3.3K ohms. |
| Resistor 28 | 68 ohms. |
| Resistor 48 | 3.3K ohms. |
| Resistor 64 | 820 ohms. |
| Resistor 66 | 560 ohms. |
| Resistor 78 | 5.6K ohms. |
| Resistor 80 | 10K ohms. |
| Resistor 82 | 22K ohms. |
| Resistor 90 | 3.9K ohms. |
| Resistor 94 | 220 ohms. |
| Inductor 52 | 3 h. |

It is to be understood that the foregoing parameters are illustrative, and should not be construed as limiting this invention. Moreover, various modifications and adaptations to the illustrated circuitry will be readily apparent to persons skilled in the art, and it is intended, therefore, that this invention be limited only by the following claims as interpreted in the light of the art.

What is claimed is:

1. In a gain controlled amplifier, the combination comprising:

a transistor for amplifying alternating current signals, said transistor having a base, an emitter, and a collector electrode;

a source of direct current biasing potential;

an emitter-resistor connected between said emitter electrode and a point of reference potential, said source of direct current biasing potential being connected between said collector electrode and said point and being poled for reversely biasing said collector electrode and for forwardly biasing said emitter electrodes;

a variable impedance device connected across said emitter-resistor;

means responsive to the magnitude of said amplified signal derived from the collector electrode of said transistor for varying the impedance of said variable impedance device in inverse relation to the magnitude of said signal, whereby the degenerative feedback due to direct currents flowing in said emitter-resistor is varied in direct relation to signal magnitude, said last-mentioned means including a second transistor having second base, emitter, and collector electrodes, said second emitter and collector electrodes being connected in series with said variable impedance device across said source;

a rectifier coupling said amplified signal to said second base, said rectifier being poled to conduct direct currents tending to back bias said transistor;

and means connected between said source and said second base electrode for forwardly biasing said second base electrode in the absence of rectified signal to produce high current flow through said second emitter and collector electrodes and said variable impedance device.

2. The invention as defined in claim 1 wherein said variable impedance device is a semiconductor diode.

3. The invention as defined in claim 1 wherein said rectifier is a semiconductor diode.

4. The invention as defined in claim 3 wherein means are provided to modulate the bias on said semiconductor diode rectifier at a rate dependent on signal magnitude, whereby the rectified signals are diode amplified.

5. The invention as defined in claim 4 wherein said means to modulate the bias on said semiconductor diode rectifier includes a second semiconductor diode rectifier.

6. In a gain controlled amplifier, the combination comprising:

at least first and second transistors cascaded for amplifying alternating current signals, each of said transistors having base, emitter, and collector electrodes;

means coupling the collector electrode of said first transistor to the base electrode of said second transistor;

a common emitter-resistor connected between each of said emitter electrodes and a point of reference potential;

a source of direct current biasing potential connected between each of said collector electrodes and said point of reference potential, said source being poled to reversely bias each of said collector electrodes and forwardly bias each of said emitter electrodes;

a variable alternating current impedance network connected across said common resistor, said network including a capacitor and a diode in series;

means coupling said alternating current signals between the base electrode of said first transistor and said point of reference potential;

and means responsive to the magnitude of said amplified alternating current signals for varying the impedance of said variable impedance alternating current network in inverse relation to the magnitude of said alternating current signals, whereby the degenerative feedback due to direct currents flowing in said common resistor is varied in direct relation to the magnitude of said signals, said last-mentioned means being coupled between the collector electrode of said second transistor and said variable impedance alternating current network.

7. The invention as defined in claim 6 wherein said means responsive to the magnitude of said amplified signals for varying the impedance of said variable impedance alternating current network comprises:

a transistor having a base, an emitter, and a collector electrode, said emitter and collector electrodes being connected in a series loop with said diode and said source;

a rectifier for rectifying said amplified signal, said rectifier being connected to said base, and being poled to produce direct currents tending to back bias said transistor; and means in the absence of rectified signals for forward biasing said base electrode to produce high current flow through said emitter and collector and said diode.

8. The invention as defined in claim 6 wherein means are provided for limiting the amplitude of said amplified alternating current signals.

9. In a gain controlled amplifier, the combination comprising:

a first electron flow control device having a first emitting electrode, a first collecting electrode and a first control electrode;

a variable impedance device, said variable impedance device having impedance characteristics which vary as an inverse function of applied current;

a source of direct current biasing potential;

means connecting said first emitting and collector electrodes in series with said variable impedance device across said source;

means for applying signal between said first control and emitting electrodes;

means for deriving amplified signals from between said first collecting and emitting electrodes;

a second electron flow control device having a second emitting electrode, a second collecting electrode and a second control electrode, said variable impedance device being connected in series with said second emitting and collecting electrodes and said source;

means for forwardly biasing said second control electrode in the absence of signal whereby maximum currents from said source flow through said variable impedance device to establish a minimum dynamic impedance for said variable impedance device;

and rectifier means coupling said amplified signals to said second control electrode for back biasing said second control electrode to reduce conduction through said variable impedance device, thereby increasing said dynamic impedance.

10. The invention as defined in claim 9 wherein said first and second electron flow control devices are transistors.

11. The invention as defined in claim 10 wherein said variable impedance device is a semiconductor diode.

12. In a gain controlled amplifier, the combination comprising:

a first transistor of one polarity type, a second transistor of opposite polarity type, and a third transistor of said one polarity type, each of said transistors having a base, an emitter, and a collector electrode, the collector of said first transistor being connected directly to the base of said second transistor, and the collector of said second transistor being connected directly to the base of said third transistor;

a two-terminal source of direct current biasing potential for operatively biasing said transistors for signal amplification, one of said terminals being connected to a point of reference potential, and the other of said terminals being connected to the collector electrodes of said first and third transistors and the emitter electrode of said second transistor;

a common emitter-resistor connected between said point of reference potential and the emitter of said first transistor through a first resistor and the emitter of said third transistor through a second resistor;

a variable impedance network connected across said first resistor and said common resistor;

an inductor in series with a semiconductor Zener diode connected between the collector electrode of said second transistor and said point of reference potential;

rectifying means for rectifying the signal output from said third transistor for producing direct currents having a magnitude directly proportional to signal magnitude; and means responsive to said direct currents for varying the impedance of said variable impedance network in inverse relation to the magnitude of said signal, said last-mentioned means being connected between said rectifying means and said variable impedance network.

13. The invention as defined in claim 12 wherein said variable impedance network comprises a capacitor in series with a semiconducting diode.

14. The invention as defined in claim 13 wherein said means responsive to said direct currents for varying the impedance of said variable impedance network comprises:

a fourth transistor having a base, an emitter, and a collector electrode, said emitter and collector electrodes being connected in series with said semiconducting diode and said source;

said rectifier being connected to said base electrode and being poled to produce direct currents tending to back bias said fourth transistor; and means in the absence of rectified signals for forward biasing the base electrode of said fourth transistor to produce high current flow through said emitter and collector and through said semiconducting diode.

15. The invention as defined in claim 13 wherein said rectifying means is a semiconductor and wherein means are provided to modulate the bias of said semiconductor at a rate dependent on signal magnitude, whereby the rectified signals are diode amplified.

References Cited by the Examiner

FOREIGN PATENTS

| | | |
|---|---|---|
| 216,799 | 8/58 | Australia. |
| 1,195,610 | 5/59 | France. |

ROY LAKE, *Primary Examiner.*

JOHN KOMINSKI, *Examiner.*